US006700382B2

(12) United States Patent
Grassmann

(10) Patent No.: US 6,700,382 B2
(45) Date of Patent: Mar. 2, 2004

(54) METHOD FOR DETECTING A SWITCHED STATE OF A SWITCH

(75) Inventor: Norbert Grassmann, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 48 days.

(21) Appl. No.: 10/122,493

(22) Filed: Apr. 11, 2002

(65) Prior Publication Data

US 2002/0149371 A1 Oct. 17, 2002

(30) Foreign Application Priority Data

Apr. 11, 2001 (DE) ........................................ 101 18 191

(51) Int. Cl.[7] ........................ G01R 31/02; G01R 27/08; G01R 31/26

(52) U.S. Cl. ....................... 324/415; 324/691; 324/705; 324/719

(58) Field of Search ................................ 324/719, 691, 324/705, 415

(56) References Cited

U.S. PATENT DOCUMENTS 4,467,391 A * 8/1984 Refoy et al. ................ 361/179
4,742,334 A * 5/1988 Teich et al. ................. 340/505

FOREIGN PATENT DOCUMENTS

| | | | |
|---|---|---|---|
| DE | 40 15 271 | A1 | 11/1991 |
| DE | 43 37 273 | C2 | 5/1995 |
| DE | 199 15 973 | C1 | 11/2000 |

* cited by examiner

*Primary Examiner*—N. Le
*Assistant Examiner*—John Teresinski
(74) *Attorney, Agent, or Firm*—Laurence A. Greenberg; Werner H. Stemer; Ralph E. Locher

(57) ABSTRACT

An interrogation of a switched state of a switch is carried out with a high interrogation current until a closed switch is detected. The following interrogations of the switched state are then carried out with a low interrogation current until a definable time period which runs starting from a detection of the closed switch or until a definable number of interrogations which is counted starting from the detection of the closed switch is exceeded. After the expiry of the time period or the number of interrogations, the interrogation is continued with the high interrogation current until a closed switch state of the switch is detected again.

3 Claims, 2 Drawing Sheets

METHOD FOR DETECTING A SWITCHED STATE OF A SWITCH

BACKGROUND OF THE INVENTION

Field of the Invention

The invention relates to a method for detecting a switched state of a switch.

In order to reduce the consumption of current in battery-operated electrical systems, in the virtually completely switched-off state, which is also referred to as a stand-by mode, only the switches which, when actuated, cause the system to be activated, are interrogated by applying an interrogation current to them. In order to be able to carry out a sufficiently precise interrogation of the switches, a switched state of the switch must be carried out with high electrical interrogation currents. This results in relatively high quiescent currents in the stand-by mode of battery-operated systems and can cause predefined quiescent current conditions to be exceeded.

In a known device, disclosed in German Patent DE 43 37 273 C2, for reducing the quiescent current in deactivated motor vehicles, a controllable switch for disconnecting loads of the electrical system from a motor vehicle battery is opened if a fault is detected in a load in the electrical system which, when the controllable switch is closed, could lead to a quiescent current which is higher than a predefined quiescent current threshold or its value is higher than a threshold value corresponding to a predefined quiescent current threshold.

In the known device, layers, for example an oxide layer, which constitute an additional electrical resistance are formed on the switch contacts of the switch which is opened for a relatively long time. This makes reliable switching of the switch possible only to a limited degree. A switch interrogation must be carried out with a relatively high electrical current in such a case.

In a further known method for interrogating switch positions switches are placed in the on and off states under the control of a microprocessor (see Published, Non-Prosecuted German Patent Application DE 40 15 271 A1). In the on state, the constant switch current that flows in this state is evaluated by the microprocessor. The negative influence of disruptive oxide layers cannot be eliminated here.

German Patent DE 199 15 973 C1 merely discloses that the voltage is lowered in order to reduce the consumption of current. However, a switched state interrogation of a switch does not take place here.

SUMMARY OF THE INVENTION

It is accordingly an object of the invention to provide a method for detecting a switched state of a switch that overcomes the above-mentioned disadvantages of the prior art methods of this general type, which can be carried out easily and which permits reliable switching of a switch.

With the foregoing and other objects in view there is provided, in accordance with the invention, a method for detecting a switched state of a switch. The method includes electrically connecting the switch to a voltage source and, when the switch is in a closed switch position, a high electrical interrogation current flows which is higher than or equal to a first current threshold value. The switched state of the switch is detected by evaluating a voltage or a current at the switch. A low interrogation current that is lower than or equal to a second current threshold value is electrically connected to the switch after the closed switch position is detected. The low interrogation current is supplied for a time period that starts at a time at which the closed switch position of the switch is detected. The first current threshold value is higher than the second current threshold value. The low interrogation current that flows when the switch is closed is increased to a value that is equal to or higher than the first current threshold value only after the time period has expired. The time period is dependent on operating conditions and/or ambient conditions of the switch.

According to the invention, in a method for detecting a switched state of a switch when the switch is closed, an interrogation current is impressed which is higher than or equal to a first current threshold value. The detection of the switched state of the switch is carried out here by evaluating a current and/or a voltage at the switch. If a closed switch is detected, when the switch is closed an interrogation current is impressed, which is lower than or equal to a second current threshold value, for a time period is which starts at the time at which a closed switched state of the switch is detect or for a number of interrogations of the switched state of the switch which is counted starting from the detection of the closed switch. The interrogation current which flows when the switch is closed is not increased again to a value which is higher than or equal to the first current threshold value until the time period or the number of interrogations of the switch position is reached. There is provision here for the time period within which the interrogation with the interrogation current is carried out to be defined as a function of operating and/or ambient conditions of the switch.

As a result, it is possible to ensure that reliable detection of the switch position and reliable switching of the switch are possible.

There may be provision for the number of interrogations of the switch position of the switch that is counted starting from the detection of a closed switch position to be made dependent on operating and/or ambient conditions.

As a result it is possible to ensure that reliable detection of a switched state and reliable switching of the switch are possible even if the layer which produces an additional electrical resistance is formed at differing rates on the switch contacts.

With the foregoing and other objects in view there is provided, in accordance with the invention, a method for detecting a switched state of a switch. The method includes electrically connecting the switch to a voltage source and, when the switch is in a closed switch position, a high electrical interrogation current flows which is higher than or equal to a first current threshold value. The switched state of the switch is detected by evaluating a voltage and/or a current at the switch. A low interrogation current that is lower than or equal to a second current threshold value is electrically connected to the switch when the closed switch position is detected. The low interrogation current is supplied for a number of interrogations of a switch position of the switch that is counted starting from a detection of the closed switch position. The first current threshold value is higher than the second current threshold value. The low interrogation current that flows when the switch is closed is increased again to a value that is equal to or higher than the first threshold value only after the number of interrogations of the switch position has been reached.

In accordance with an added mode of the invention, there is the step of setting the number of interrogations of the switched position of the switch that are counted starting from the detection of the closed switch position in dependence on operating conditions and/or ambient conditions of the switch.

Other features which are considered as characteristic for the invention are set forth in the appended claims.

Although the invention is illustrated and described herein as embodied in a method for detecting a switched state of a switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

If a battery-operated system is switched to the stand-by mode, the switches and their switched states which, when they are actuated, cause the system to be "woken up" into the fully operationally capable state are interrogated.

The present switched state of the switch is detected by evaluating a voltage and/or a current which are present at the switch and which flow via the switch, respectively. For evaluation purposes, a relatively low current is impressed, the current flowing when the switch is closed. If the switch contacts of the switch are free of layers that form an additional resistance, the relatively low current is sufficient to permit relatively reliable detection of the switched state. However, because such undesired layers are formed on the switch contacts of an opened switch, detection of the switched state is falsified. For this reason, the current that flows when the switch is closed must be increased in such a way that a relatively reliable detection of the switched state is possible even if such undesired layers are present on the switch contacts. Predefined quiescent current conditions can often no longer be satisfactorily fulfilled when the switched state of the switch is interrogated with such relatively high currents.

Figure 1:
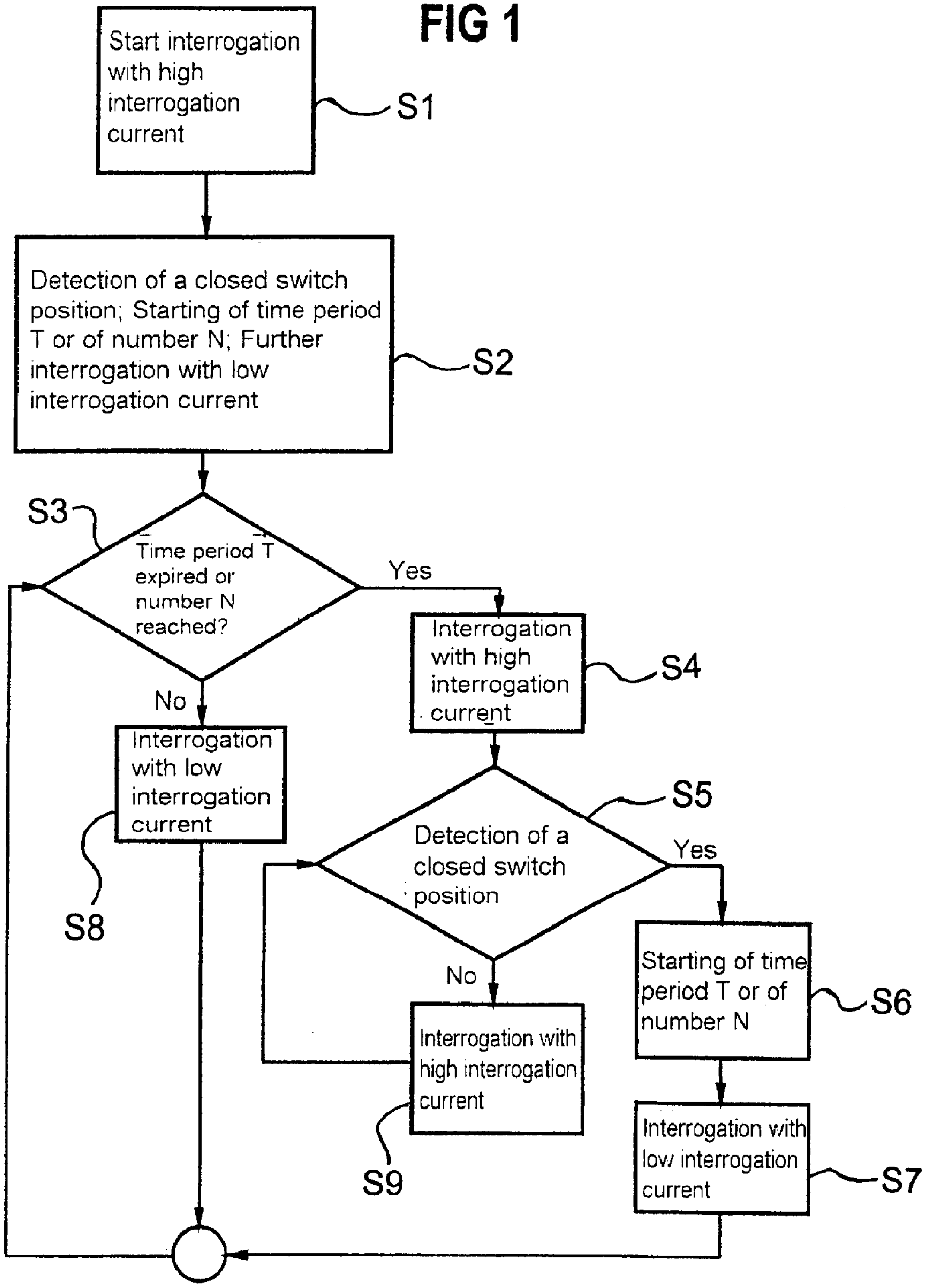
FIG. 1 is a flowchart of the method according to the invention.

Referring now to the figures of the drawing in detail and first, particularly, to FIG. 1 thereof, there is shown a method according to the invention for detecting a switched state of a switch. The method starts by interrogating the switched state according to step S1. Here, a voltage value of a voltage that is present at the switch is defined in such a way that when the switch is closed an interrogation current 4 that is equal to or higher than a first current threshold value is impressed. The current is subsequently referred to as a high interrogation current. As a result of the fact that, when the switch is opened, a layer, for example an oxide layer, forms on the switch contacts as a function of the period of time for which the opened state lasts. The layer produces an additional electrical resistance that prevents reliable detection of the switched state and reliable switching of the switch because the current that flows via the switch becomes lower.

For this reason, the first voltage value is defined in such a way that the high interrogation current that flows when the switch is closed is sufficient to influence the undesired layer on the switch contacts at least to such an extent that the switched state can be reliably detected. This is possible if the switch is closed and the high interrogation current can thus flow via the switch. In the exemplary embodiment, the first current threshold value of the high interrogation current is defined as being approximately 20 mA.

If, according to step S2, a closed switch position of the switch is detected by evaluating a measured voltage value and/or current value by a control unit, any subsequent interrogation of the switch position of the switch is carried out with a second voltage value of a voltage present at the switch. The second voltage value impresses, when the switch is closed, an interrogation current that is defined as being equal to or lower than a second current threshold value. The current is subsequently referred to as a low interrogation current. The second current threshold value is defined here in such a way that the low interrogation current is at least sufficient to detect a switch position with sufficient precision. Further, the interrogation current does not need to have a value that is high enough to also permit layers on the switch contacts to be reduced, as must be the case, on the other hand, when there is a high interrogation current.

Furthermore, the interrogation is then carried out with the low interrogation current for a definable time period T that runs starting from the time when the closed switch position of the switch is detected. The time period T is defined here in such a way that the layer can be formed on the switch contacts only to an extent such that it can at least partially be is reduced again by an interrogation with the high interrogation current. Therefore, the time period T is, for example, selected to be relatively short if operating and/or ambient conditions of the switch, for example temperature or moisture, cause rapid formation of such a layer on the switch contacts of the switch.

Interrogation of the switch position with the low interrogation current according to step S3 is carried out regardless of whether the switched state of the switch changes from the closed state to the open state and back again once or repeatedly in the defined time period T. As a result, any subsequent interrogation of the switch position of the switch within the defined time period T is carried out with the low interrogation current starting from the first detection of a closed switch position of the switch.

If the time period T has expired, the voltage which is present at the switch is changed again to the first voltage value, with the result that the high interrogation current according to step S4 thus flows again when the switch is next in the closed state. The voltage corresponding to the first voltage value is present here again at the switch until a closed switched state of the switch is detected and a high interrogation current thus flows via the switch according to step S5.

Starting from the time from which the closed switch position of the switch is detected again, the time period T according to step S6 begins to run again and the interrogation of the switch position of the switch is carried out again according to step S7 within the time period T using the low interrogation current which flows when the switch is closed.

Should the time period T not have expired in step S3, interrogation with the low interrogation current continues according to step S8.

If no closed switch position of the switch is detected in step S5, the interrogation continues with the high interrogation current according to step S9.

The method will be explained once more in summary by an example and with reference to FIG. 2.

Figure 2:
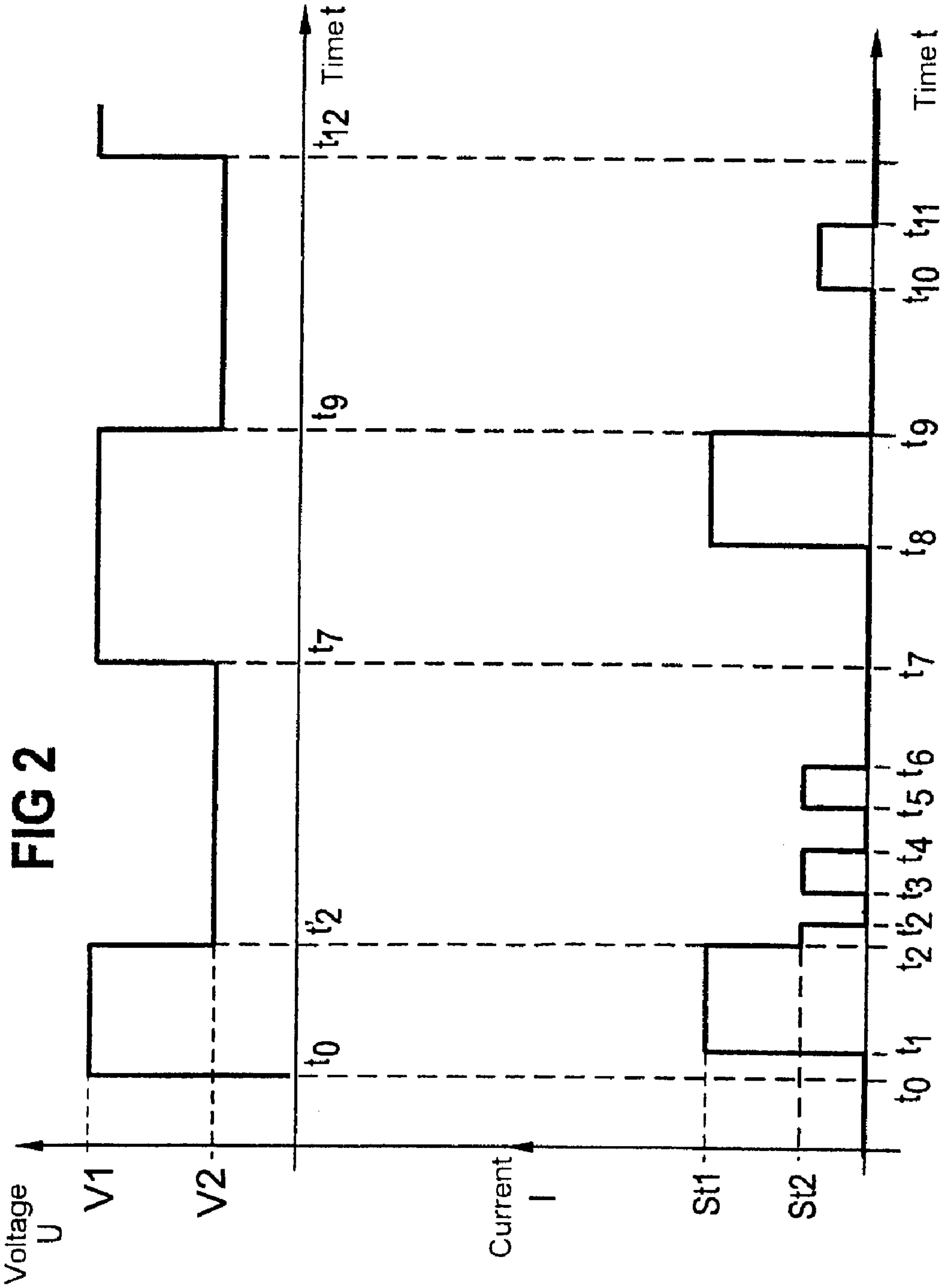
FIG. 2 is a graph showing a voltage and current profile at a switch when a switched state is interrogated.

The voltage which is present at the switch when the switched state is interrogated is plotted here in the upper diagram in FIG. 2. If an interrogation is started at a time $t_0$, a voltage that corresponds to a first voltage value V1 is present at the switch. At the time $t_0$, the switch is opened with the result that no interrogation current flows via the switch. The switch is not closed, and a closed switched state is not detected, until a time $t_1$.

According to the current diagram, an interrogation current which is equal to a current threshold value ST1 thus flows via the switch starting from the time $t_1$. The high interrogation current flows for a time period between $t_1$ and $t_2$. The time period between $t_1$ and $t_2$ is the minimum time period for which the high interrogation current must flow via the switch in order to reduce the layers forming an additional resistance on the switch contacts. At a time $t_2$, the voltage at the switch is changed to the second voltage value V2 in accordance with the illustration in the voltage diagram. If the switch continues to be closed, a low interrogation current which is higher than or equal to a current threshold value ST2 flows according to the illustration in the current diagram.

Current stops flowing via the switch only when the switch is opened again at a time $t'_2$. In a time period from $t_2$ to $t_7$, the voltage value V2 is present at the switch. The time period from $t_2$ to $t_7$ corresponds to the time period T according to the statements above. In the current diagram it is apparent that there is an opened switch between the times from $t'_2$ to $t_3$, from $t_4$ to $t_5$ and from $t_6$ to $t_7$ because no current flows via the switch. The switch is closed between the times $t_3$ and $t_4$ and between $t_5$ and $t_6$ and a low interrogation current flows via the switch.

At the time $t_7$, the time period T has expired and the voltage that is present at the switch is increased again to the voltage value V1. According to the illustration in the current diagram, a closed switched state is not detected again until the time $t_8$, and the high interrogation current flows via the switch again in the time period between $t_8$ and $t_9$. The time period between $t_8$ and $t_9$ corresponds here to the time period between $t_1$ and $t_2$ in the current diagram.

The time periods between $t_0$ and $t_2$ and between $t_7$ and $t_9$ in the voltage diagram are of different lengths in the exemplary embodiment because the voltage with the voltage value V1 is present at the switch until a closed switch is detected.

In the voltage diagram, the time period between $t_9$ and $t_{12}$ corresponds to the time period between $t_2$ and $t_7$.

In the current diagram it is apparent that at the time $t_9$, the switch is opened again and no low interrogation current thus flows via the switch. Only at the time $t_{10}$ is the switch closed again until the time $t_{11}$, and the low interrogation current flows via the switch.

The voltage values of the voltage that are present at the switch can be generated, for example, by a voltage source. The voltage values can, however, also be set by a controllable resistor that changes a constant current value of the voltage source.

There may also be provision for the interrogation with the low interrogation current to be carried out as a function of a definable number N of interrogations after the detection of a closed switch position. If a closed switch is first detected here, it is possible, for example, to define that the voltage corresponding to the second voltage value is present at the switch until five further closed switched states are detected and thus five times a low interrogation current flows via the switch. If the five closed switched states of the switch are interrogated, interrogation is carried out again with the high interrogation current, specifically until a closed switched state of the switch is detected again.

With the method, it is also possible to interrogate a plurality of switches and their switched states. For each individual switch it is possible to detect the time at which a closed switched state of the respective switch is sensed, and it is thus detected from which time the time period T for each individual switch starts or starting from what time the number N is counted for each individual switch. As a result it is possible to ensure that reliable detection of a switched state and reliable switching of the switch is possible for each individual switch.

I claim:

1. A method for detecting a switched state of a switch, which comprises the steps of:

electrically connecting the switch to a voltage source and, when the switch is in a closed switch position, a high electrical interrogation current flows which is higher than or equal to a first current threshold value;

providing the high electrical interrogation current for reducing undesired layers that form on contacts of the switch;

detecting the switched state of the switch by evaluating at least one of a voltage and a current at the switch;

electrically connecting a low interrogation current which is lower than or equal to a second current threshold value to the switch after the closed switch position is detected, the low interrogation current being supplied for a pre-selected time period which starts at a time at which the closed switch position of the switch is detected, the first current threshold value being higher than the second current threshold value; and increasing the low interrogation current which flows when the switch is closed to a value which is equal to or higher than the first current threshold value only after the time period has expired, the time period being dependent on at least one of operating conditions and ambient conditions of the switch.

2. A method for detecting a switched state of a switch, which comprises the steps of:

electrically connecting the switch to a voltage source and, when the switch is in a closed switch position, a high electrical interrogation current flows which is higher than or equal to a first current threshold value;

providing the high electrical interrogation current for reducing undesired layers that form on contacts of the switch;

detecting the switched state of the switch by evaluating at least one of a voltage and a current at the switch;

electrically connecting a low interrogation current which is lower than or equal to a second current threshold value to the switch when the closed switch position is detected, the low interrogation current being supplied for a number of interrogations of a switch position of the switch which is counted starting from a detection of the closed switch position, the first current threshold value being higher than the second current threshold value; and increasing the low interrogation current which flows when the switch is closed again to a value which is equal to or higher than the first current threshold value only after the number of interrogations of the switch position has been reached.

3. The method according to claim 2, which comprises setting the number of interrogations of the switched position of the switch which are counted starting from the detection of the closed switch position in dependence on at least one of operating conditions and ambient conditions of the switch.

* * * * *